United States Patent [19]
Foster

[11] Patent Number: 5,963,850
[45] Date of Patent: Oct. 5, 1999

[54] METHOD AND APPARATUS FOR VERIFYING THE OPERABILITY OF A BALANCED DIODE MIXER AND LOCAL OSCILLATOR COMBINATION

[75] Inventor: John E. Foster, Huntington, N.Y.

[73] Assignee: Pittway Corp., Chicago, Ill.

[21] Appl. No.: 08/761,533

[22] Filed: Dec. 6, 1996

[51] Int. Cl.⁶ ............................ G08B 29/00; H04B 17/00
[52] U.S. Cl. ................... 455/67.5; 455/226.1; 340/513; 340/516
[58] Field of Search ................................ 455/226.1, 326, 455/327, 423, 425, 67.1, 67.4, 67.5, 226.14; 340/501, 505, 506, 507, 513, 514, 516, 539, 554

[56] References Cited

U.S. PATENT DOCUMENTS

| | | |
|---|---|---|
| 3,750,165 | 7/1973 | Bailey et al. . |
| 3,787,854 | 1/1974 | Friedman et al. . |
| 3,805,262 | 4/1974 | Klein et al. . |
| 3,832,709 | 8/1974 | Klein et al. . |
| 3,838,408 | 9/1974 | McMaster . |
| 3,928,849 | 12/1975 | Schwarz .................................. 340/516 |
| 4,027,303 | 5/1977 | Neuwirth et al. . |
| 4,286,260 | 8/1981 | Gershberg et al. . |
| 4,322,722 | 3/1982 | Kozdon . |
| 4,417,157 | 11/1983 | Gershberg et al. . |
| 4,743,886 | 5/1988 | Steiner .................................... 340/514 |
| 4,772,875 | 9/1988 | Maddox et al. . |
| 4,875,198 | 10/1989 | Ariav . |
| 5,083,106 | 1/1992 | Kostusiak et al. . |
| 5,093,656 | 3/1992 | Dipoala . |
| 5,136,298 | 8/1992 | Williams . |
| 5,196,826 | 3/1993 | Whiting . |
| 5,262,783 | 11/1993 | Philpott et al. .......................... 455/327 |
| 5,331,308 | 7/1994 | Buccola et al. . |
| 5,450,062 | 9/1995 | DiPoala . |
| 5,491,467 | 2/1996 | Tracy et al. . |
| 5,499,016 | 3/1996 | Pantus ..................................... 340/506 |
| 5,629,875 | 5/1997 | Adair, Jr. ............................... 455/67.1 |

OTHER PUBLICATIONS

Herbert L. Krauss & Frederick H. Raad, Solid State Radio Engineering, 1980, pp. 192–200.

Bert C. Henderson, "Mixers: Part 2, Theory and Technology", pp. 701–702.

*Primary Examiner*—Reinhard J. Eisenzopf
*Assistant Examiner*—Lester G. Kincaid
*Attorney, Agent, or Firm*—Anthony R. Barkume, P.C.

[57] ABSTRACT

A method and apparatus for testing a balanced diode mixer and local oscillator combination in a microwave receiver. The diodes comprising a balanced mixer are unbalanced in a selective, controlled manner to generate an offset signal. The unbalancing of the mixer is accomplished by heating one of a pair of mixer diodes. By measuring an offset voltage output of the balanced diode mixer after one of the diodes has been heated, it is possible to measure an artificially created diode mismatch offset voltage and thereby verify that the balanced mixer/oscillator combination is working properly. The heating step is performed by either forward biasing the mixer diode or by placing a resistive heating element adjacent to the diode.

16 Claims, 4 Drawing Sheets

METHOD AND APPARATUS FOR VERIFYING THE OPERABILITY OF A BALANCED DIODE MIXER AND LOCAL OSCILLATOR COMBINATION

BACKGROUND OF THE INVENTION

1. Field of the Invention

This invention relates to a method and apparatus for confirming that a microwave oscillator and balanced diode mixer combination is operating properly.

2. Description of the Prior Art

Microwave doppler type motion detectors are commonly used in connection with intruder alarms and automatic door opening systems. Such detectors operate by transmitting a microwave field within a volumetric space. They detect the presence of an intruder by receiving an echo signal, the frequency of which is shifted from the original frequency by an amount which is proportional to the relative velocity of the intruder. One type of receiver circuit which can be used for detecting the Doppler echo signal is a common balanced diode mixer/oscillator combination. Balanced diode mixers provide a simple and effective means for converting a high frequency microwave signals (RF) to an intermediate frequency (IF) doppler signal, which is more suitable for amplification and signal processing.

In order to operate, such balanced diode mixers generally require a microwave source to serve as a local oscillator. Various types of microwave sources, such as a Gunn diode or transistor-based microwave circuits, may be used for this purpose. However, over a period of time, the microwave source is prone to degradations in performance and failure. Such degradations in performance will have an adverse impact upon the operation of the mixer. Further, in Doppler type motion detectors, it is common to make use of a single microwave source to provide a local oscillator signal and a transmit signal. In such cases, the local oscillator signal may be derived by coupling a portion of the microwave transmit signal from the transmission line carrying the transmit signal to the transmitting antenna. If the power output level of the microwave source is low or if an antenna fault exists, the power output of the microwave source will most likely be decreased. This will also lead to a degradation in the performance of the motion detector. Thus, it is desirable to be able to periodically verify the performance of the microwave source.

Various methods are possible for verifying the performance of the microwave source in the foregoing types of systems. For example, means may be provided for coupling a portion of the RF signal generated by the microwave source to a detector so as to directly measure the RF output of the source. However, such systems have the disadvantage of being relatively expensive. As an alternative, some systems have developed a method of testing or verifying the performance of the microwave source by detecting an offset voltage, which is generated by an imbalance with respect to the diode pair which are used as part of the balanced mixer. This means of testing relies upon the fact that the diodes which are commonly used within the above-referenced balanced mixer circuit are often slightly mismatched with regard to their electrical characteristics. Thus, when the microwave source signal is applied from the local oscillator, a small offset voltage is generated. This offset signal can be as much as a few millivolts or less than a few microvolts, depending on how closely the two diodes are matched. If the signal is sufficiently large, it can be detected after passing through the amplifier circuitry, in a manner analogous to and at a signal level comparable to that of the doppler signal—which is the preferred condition.

Although the foregoing test method has proved acceptable in the past, a problem has arisen as a result of diode components which are more consistent with regard to their manufacturing tolerances. Specifically, because of improvements in the manufacturing for the commercially available diodes used in such balanced mixers, it has been found that their electrical characteristics have become more closely matched. Significantly, when such diodes are used in the context of a balanced mixer, the offset voltage, which had previously been relied upon to verify the operation of the microwave source, may no longer be present. In other words, the diodes may be so well matched that an offset signal is no longer present, or may be too near the noise threshold of amplifier circuits to be easily detected. While the output of the balanced mixer is typically coupled to an amplifier of relatively high gain in order to sense the doppler motion signal, the offset voltage may not produce an easily verified signal at the amplifier output if the offset signal is too small. It is not, moreover, usually desirable to increase the gain of the amplifier beyond a certain point for the purpose of detecting lower magnitudes of offset voltage, since to do so would add cost and could possibly cause interference with the dynamic range and signal to noise ratio of the amplifier. If the dynamic range or signal to noise ratio of the amplifier were adversely affected in this regard, it could conceivably interfere with the primary purpose of such circuitry, i.e., distinguishing doppler signals created by motion from spurious sources such as electrical noise.

Further, while the offset voltage method described above can be used to verify that the microwave source is operating, it does not provide a reliable means for determining if there has been any degradation in power output. At best, the foregoing method can only provide a binary result, i.e., the microwave source is working/not working. Also, if both diodes suffer a failure in the open state, no offset signal will be generated and confirmation of proper operation cannot be made.

Thus, it is an object of this invention to provide an improved method and apparatus for verifying the presence of a microwave source signal when the source is used in conjunction with a balanced mixer circuit. It is a further object of this invention to provide a method and apparatus for obtaining an approximate indication of the power output of the microwave source, so as to determine whether the source is operating within a desired range. It is still a further object of the invention to enable verification of an entire microwave receiver circuit i.e. a local oscillator, balanced mixer, IF amplifier and motion detection circuitry. Finally, it is also an object of the invention to create a repeatable test with known input parameters, whereby the test results of a current test may be compared with a previously stored test result.

SUMMARY OF THE INVENTION

The present invention concerns a method and apparatus for testing a balanced diode mixer and local oscillator combination in a microwave receiver. According to the method, the non-linear devices (typically diodes) comprising a balanced mixer may be unbalanced in a selective, controlled manner to generate an offset signal. More particularly, a local oscillator is coupled to a mixer input defined between a first and second series connected mixer diode comprising a balanced mixer. Next, at least one of the mixer diodes is heated in order to modify its electrical characteristics. By measuring an offset voltage output of the balanced diode mixer after one of the diodes has been heated, it is possible to measure an artificially created diode mismatch offset voltage. According to a preferred embodiment of the invention, the heating step is performed by forward biasing one or the other of the mixer diodes. Further, the heating step is preferably performed at a predetermined interval (such as once each day) and in a predetermined amount, as determined by a microprocessor.

According to an alternative embodiment of the invention, the output of the balanced diode mixer circuit can be measured, prior to heating either of the mixer diodes, to measure a diode mismatch offset voltage is present. This measurement results in a baseline offset value, which may be stored by the microprocessor. Subsequently, at least one of the mixer diodes can be heated in known increments until the diode mismatch offset voltage is measured to be about zero volts. Once the mismatch has been zeroed out in this manner, a relative power output level of the local oscillator may be determined based upon the amount of heating or power required to eliminate the offset voltage. More particularly, the amount of power applied to heat the mixer diode can be recorded by the microprocessor, and then used to estimate an approximate equivalent power output of the microwave source.

DETAILED DESCRIPTION OF THE INVENTION

Figure 1:
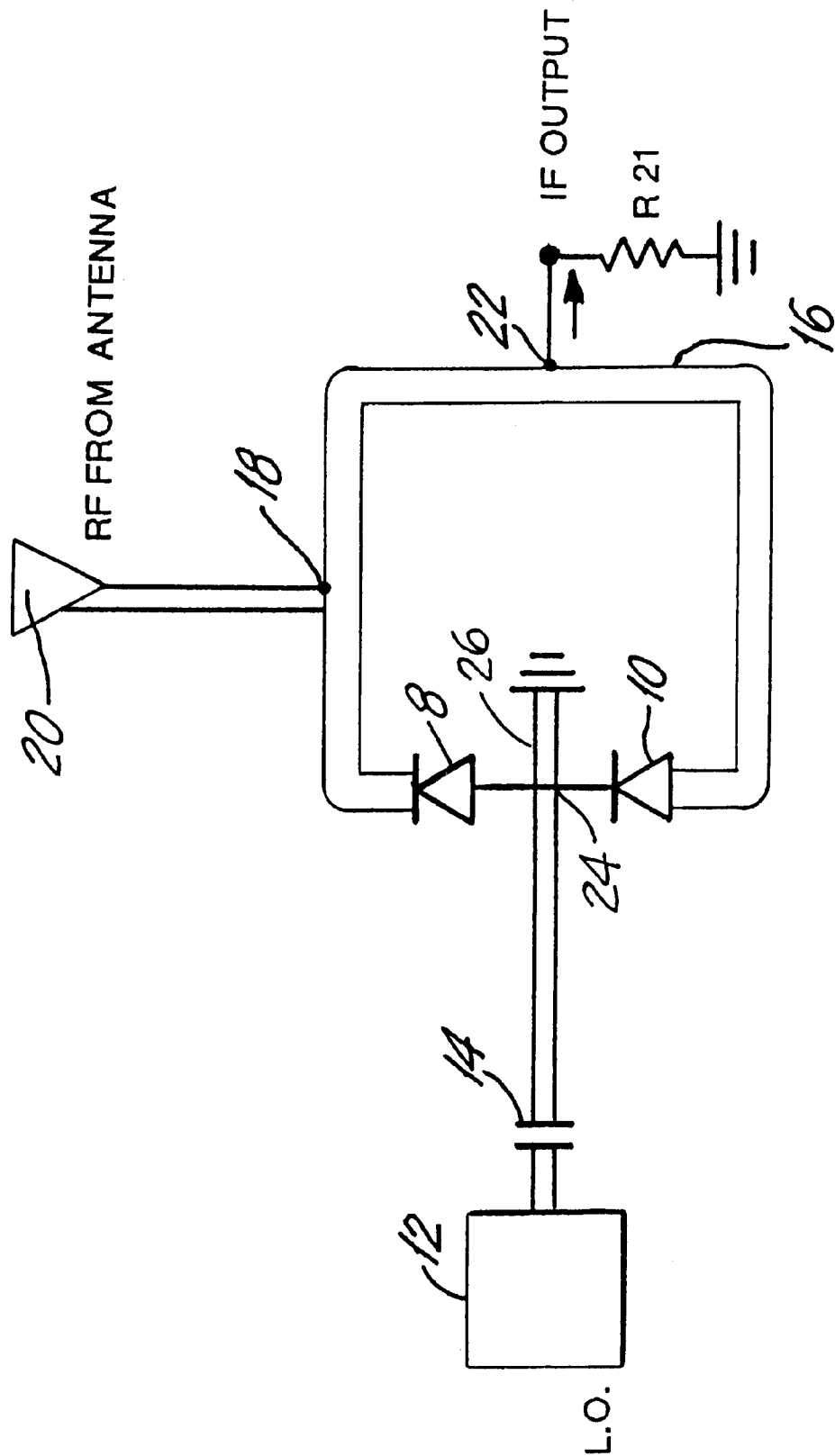
FIG. 1 is a circuit diagram showing a prior art single balanced diode mixer and local oscillator combination.

As shown in FIG. 1 the single balanced diode mixer is comprised of a pair of diodes 8, 10 which are connected as shown. As is well known to those familiar with the art, single balanced mixer utilizes two or more non-linear devices, such as diodes. Either the local oscillator or the RF signal is applied in a push-pull configuration. In this manner, it is possible to ensure that either the local oscillator signal or the RF signal, and their respective odd harmonics, do not appear at an output or IF port.

In FIG. 1, the common connection between the two diodes defines a mixer input port 24, which is capacitively coupled to a local oscillator 12 through a capacitor 14. The mixer input port 24 is connected to circuit ground through a ¼ wavelength (at the local oscillator frequency) transmission line. The ¼ wavelength transmission line provides a low impedance path to circuit ground (i.e. ground reference) at low frequency and a high impedance at the microwave frequency. The other ends of the diodes 8, 10 are connected via a stripline section 16.

An RF input 18 to the mixer is provided from a microwave antenna 20. The RF signal path of the stripline section between the RF input port 18 and port 24 through diode 8 is designed to be one quarter-wavelength at the frequency of the local oscillator. The RF signal path of the stripline sections between the RF input port 18 and port 24 through diode 10 is designed to be three quarter wavelengths at the microwave operating frequency. The electrical distance from port 24 to 22 is equal (½ wavelength) through either diode path, and balances out the RF signal coming into port 24. In particular, this arrangement, as is known to those skilled in the art, increases the signal to noise ratio when a doppler signal is returned to the receiving antenna. Significantly, although a specific balanced mixer arrangement is shown in FIG. 1, it should be understood that other balanced mixer circuits are also possible and the invention is not limited in this regard.

The down-converted doppler frequency signal (IF) of the balanced mixer is available for further amplification and processing at IF output port 22. Typically, the presence of this doppler frequency IF signal is an indication of the presence of a moving target or intruder in the field of view of the antenna 20. Mixers of the foregoing design have the advantage of reduced phase noise and improved sensitivity.

One problem with balanced mixers such as that shown in FIG. 1, is that if the diodes 8, 10 are not well matched with regard to their electrical characteristics, an offset voltage will be generated at the IF output port 22 when a local oscillator signal is present at input port 24. In order to understand the source of this offset signal, it is helpful to understand the operation of the balanced mixer. In FIG. 1, a microwave signal is coupled to input port 24. The positive half of the wave comprising the microwave signal (usually a sine wave) will forward bias diode 8 and cause a current to flow through resistor 21, to circuit ground. Conversely, for each negative excursion of the microwave signal, diode 10 will be forward biased and current will flow through resistor 21 in an opposite direction. Thus, the diodes will be biased alternately into conduction. Since the diodes are non-linear devices, i.e. the flow of current is not directly proportional to terminal voltage, the circuit will be ready to down-convert a received microwave signal arriving at input port 18. Typically, the mixer output at port 22 will include at least the sum and difference frequencies of the signals which are applied to the input ports 18 and 24.

In the case where the balanced mixer is used in a motion detection system, the frequency coupled to input port 24 will be locked to the transmit frequency, and the received signal will be offset by some doppler shift value. If an object is moving in the area where the motion detector is operating, the difference between the two signals applied to the mixer will represent the doppler shift. In the case where the received signal is exactly equal to the transmitted signal or is not present, the output voltage of the mixer at resistor 21 will be zero, provided that the mixer diodes 8, 10 are balanced and the electrical distance between each diode and port 22 is equal. This is so because there will be no net signal created across resistor 21. By symmetry, the current flow through resistor 21 will have a time average value of zero when taken over many cycles for the microwave signal.

Alternatively, if the mixer diodes are not matched there will be a net positive or negative voltage developed at the output port 22 of the mixer. In the case where the received signal is not shifted in frequency, or is not present, then the offset voltage at port 22 will be a simple D.C. level.

Significantly, for reasons of improved performance and efficiency, it is often desirable to switch the local oscillator on and off rather than allow it to operate continuously. For example, it may be desirable to lower the duty cycle of the local oscillator so as to increase its peak power output. Since the local oscillator also serves as the microwave transmitter source in many instances, increasing the peak power output of the source can improve the signal to noise ratio for the doppler motion signal. Operating the local oscillator in a switched mode may also be preferred in order to avoid the problems normally associated with D.C. drifts, and so that the signal can be amplified by the receiver circuitry, which is preferably capacitively coupled. In any event, if the local oscillator is operated in a switched mode (i.e., operated at a duty cycle of less than 100%), the offset signal will have a frequency equal to the local oscillator on/off switching rate.

Figure 2:
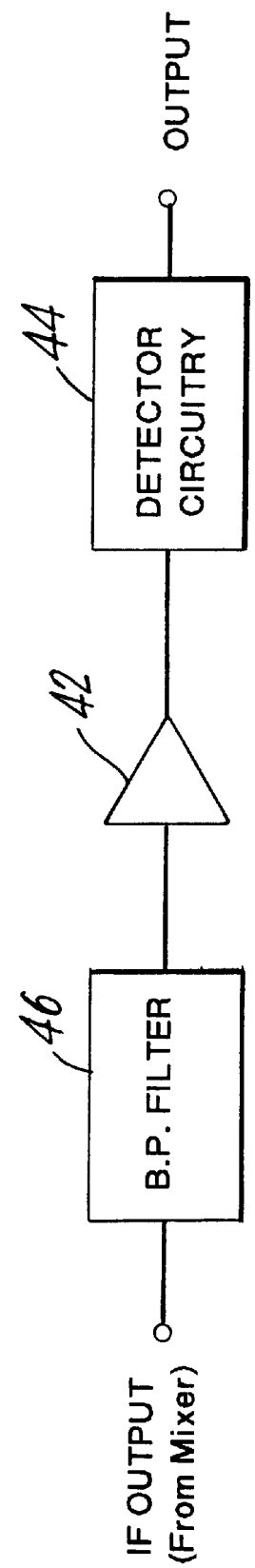
FIG. 2 is a circuit diagram showing an IF amplifier and detection circuitry for use with the balanced diode mixer in FIG. 1.

While the foregoing offset signal can sometimes be undesirable, it can also serve a useful purpose to the extent that it can be used to verify that the local oscillator 12 is operating. For example, as shown in FIG. 2, it is known that the I.F. output of the balanced diode mixer in FIG. 1 can be coupled through a band pass filter 46 to an I.F. amplifier 42. The I.F. amplifier 42 provides an amplified IF signal to detector circuitry 44. If the microwave source 12 is switched at a frequency, e.g. 100 Hz, which is within the pass band of filter 46, then the offset signal generated by any diode imbalance will be amplified by I.F. amplifier 42, and will be available for detection by detector circuitry 44. The presence of such offset signal will indicate that the receiver circuitry (including the microwave source) is working properly. Significantly, if the diodes 8, 10 are matched or nearly matched, then the offset signal will not be present or will be insufficiently large to be amplified and detected. In such cases, it will not be possible to confirm that the system is functioning.

Figure 3:
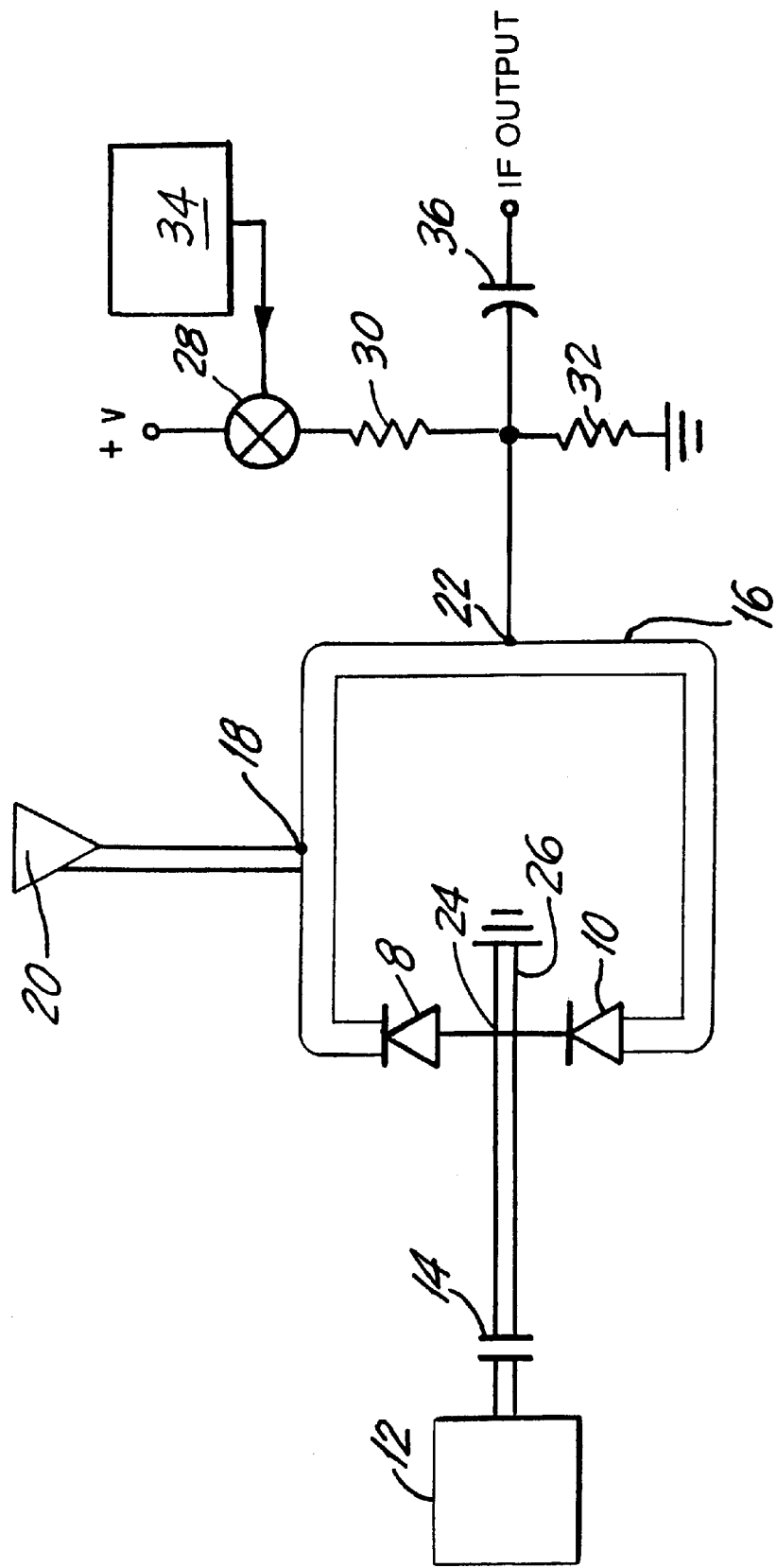
FIG. 3 is a circuit diagram showing the balanced diode mixer and local oscillator combination of FIG. 1, electronically coupled to a test system according to the present invention.

FIG. 3 shows the balanced mixer and local oscillator combination of FIG. 1, electronically coupled to a preferred embodiment of a test circuit according to the present invention. The IF output signal from the mixer in FIG. 3 is preferably electronically coupled to detection circuitry similar to that discussed with reference to FIG. 2. The test circuit is preferably comprised of a voltage source coupled through an electronically controlled switch 28. The switch 28 controls the flow of current to a current limiting resistor 30 and a voltage divider resistor 32. When the electronically controlled switch 28 is toggled to its on position, a current will flow through either diode 8 or 10 (depending upon voltage polarity). The switch 28 is preferably controlled by a microprocessor 34 which can be programmed to perform a periodic self test of the balanced mixer/local oscillator combination.

This flow of current will momentarily heat either diode 8 or 10, thereby changing its voltage drop in a forward biased condition. For microwave mixer diodes commonly used in motion detection systems, the forward voltage drop will change at a rate of about 2 millivolts per degree Centigrade. Subsequently, within a short time after heating the diode (i.e., preferably within a few tens of milliseconds) the electronically controlled switch is switched to its open position. At this time, an operational test is preferably performed to detect the presence of an offset voltage, if any, caused by the artificially induced mixer imbalance. If the diodes were previously balanced during manufacturing or were unbalanced during manufacturing and later balanced due to in situ heating of the diodes caused by a temperature gradient within the room or within the enclosure surrounding the diodes, then an imbalance will result from the heating of one of the diodes and this will result in a measurable offset voltage which verifies that the local oscillator is functioning.

Figure 4:
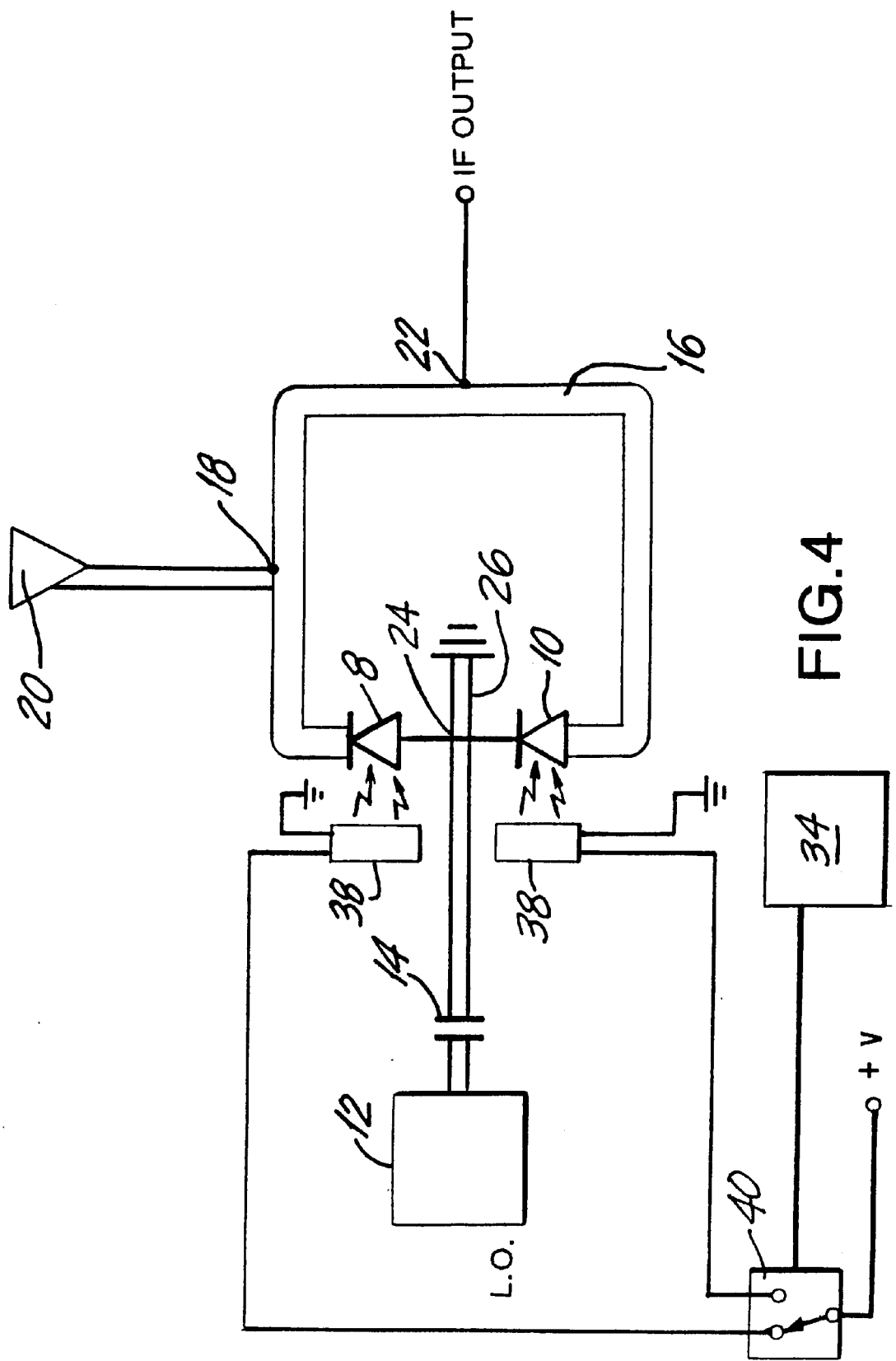
FIG. 4 is a circuit diagram showing the balanced diode mixer and local oscillator combination of FIG. 1, with an alternative embodiment of the test system according to the invention.

Significantly, while the method of heating diodes 8 or 10 to produce an artificial imbalance can be performed as described above, the invention is not limited in this regard. For example, instead of forward biasing diodes 8 or 10 to obtain a heating effect, such heating can be obtained indirectly by means of one or more heater units 38, as shown in FIG. 4. The heater units 38 may be comprised of a pair of resistors, each placed adjacent to one of the diodes. However, any electronically controllable means for heating diodes 8 or 10 can be used for this purpose.

As shown in FIG. 4, when either of the heater units 38 is switched on, the adjacent diode 8 or 10 is heated. This heating effect produces a change in the forward voltage drop for the particular diode which has been heated, and thereby causes a mixer imbalance as described above. The heater units 38 are preferably turned on and off by means of an electronic switch 40. Switch 40 is preferably controlled by microprocessor 34. However, any other suitable control means can also be used for this purpose and the invention is not limited in this respect. Similarly, any other means may also be used to alter the electrical characteristics of diodes 8, 10 so as to artificially create a mixer imbalance.

The foregoing artificially induced mixer imbalance can be used in one of several ways to test the operability of the balanced mixer/local oscillator combination shown in FIG. 1. For example, if the system self test is performed alternately with and without an artificially induced offset as described herein, an unbalanced condition must exist during one mode of testing. Thus, if local oscillator 12 is operating, an offset signal resulting from a diode imbalance will be detected in one of the two test modes. This offset can be detected and used to indicate that the system is operating.

Further, since the local oscillator signal in certain applications, such as motion detectors, is commonly coupled from a microwave source which is also used to drive a transmitting antenna, the offset signal may be used to confirm that the microwave source for the transmitter is delivering adequate power to a transmitting antenna. This can be accomplished since a failure of the microwave transmitter source or the transmitting antenna, will typically result in a decrease in power delivered from the microwave source.

The presence of the offset signal not only confirms that the local oscillator is generating an output signal, but also that the particular diode which has been heated is not open circuited. In addition, it can also be used to verify that the diode which has not been heated is also not open circuited, since loss of only one diode will result in a very large offset voltage, much greater than the offset which occurs due to mixer diode imbalance. Finally, the foregoing methodology can also be used verify that both diodes are not simultaneously open circuited since, in that case, the offset voltage could not be changed by heating one of the diodes. Thus, both the RF output of the local oscillator and the presence of the diodes are confirmed.

Alternatively, instead of achieving a simple binary pass/fail test result, it is possible to use the foregoing artificially induced imbalance to obtain a rough estimate of quantitatively how well the local oscillator is performing, at least with respect to power output. More particularly, by controlling the length of time that the electronic switch 28 is toggled to its "on" position, and the amount of current applied to the diodes, the specific amount of heating of such diodes may be controlled. By using this information, and well known data concerning the effect of temperature upon the current vs. voltage curve for the particular diode device, it is possible to obtain a rough estimate as to the quantitative output of the local oscillator. If the mixer is not balanced, then one diode may be heated in known increments to result in an artificially induced mixer balance. Alternatively, if the mixer is balanced, one diode may be heated until a particular offset level is measured. In either case, given the amount of energy required to heat the diode it is possible to extrapolate an approximate local oscillator power output level. The accuracy of this determination may be improved, furthermore, as will be recognized by those skilled in the art, by providing an input to the microprocessor of the ambient temperature, thus allowing the effect of the ambient temperature to be subtracted out.

Finally, the present invention has been described in terms of a single balanced mixer as shown in FIG. 1. However, it should be understood that the invention will work with other single balanced mixer circuits, and the invention is not limited in this regard. In fact, the present invention can be applied to essentially any mixer circuit where it is possible to perturb a non-linear mixer ciruit element from a steady state condition, by heating, and then comparing a resulting modified output signal to a baseline output signal level.

I claim:

1. A method for determining the operability of a balanced diode mixer and local oscillator combination in a microwave receiver, said method comprising:

operating said balanced diode mixer by coupling a microwave signal from said local oscillator to a mixer input defined between a first and second series connected mixer diode;

heating at least one of said first and second mixer diodes to modify its electrical characteristics such that a mismatch between said electrical characteristics of said first and second series connected mixer diode is accentuated;

measuring an output of said balanced diode mixer to measure a diode mismatch offset voltage.

2. The method according to claim 1 wherein said heating step is performed by forward biasing at least one of said first and second mixer diodes.

3. The method according to claim 1 wherein said heating step is performed at a predetermined interval and the amount of heating is controlled by a microprocessor.

4. The method according to claim 1 further comprising the step of measuring an output of said balanced diode mixer, prior to heating said at least one mixer diode, to determine if a diode mismatch offset voltage is present.

5. The method according to claim 4, further comprising the step of heating at least one of said mixer diodes in known increments until said diode mismatch offset voltage equals approximately zero volts.

6. The method according to claim 5, further comprising the step of determining a relative power output level of said local oscillator based upon the amount of heating required to cause said offset voltage to equal approximately zero volts.

7. An apparatus for determining the operability of a mixing circuit having a local oscillator coupled to a balanced mixer via a mixing input defined between a first and second series connected mixer diode, said apparatus comprising:

means for heating at least one of said first and second series connected mixer diodes to modify its electrical characteristics such that a mismatch between said electrical characteristics of said first and second series connected mixer diode is accentuated;

means for measuring a diode mismatch offset voltage at an output of said balanced diode mixer.

8. The apparatus according to claim 7 wherein said means for heating comprises a voltage source for temporarily forward biasing at least one of said first and second mixer diodes.

9. The apparatus according to claim 8 wherein the application of said voltage source to said at least one mixer diode is controlled by a microprocessor.

10. The apparatus according to claim 7 wherein said means for heating is controlled by a microprocessor.

11. The apparatus according to claim 10 wherein at least one of a heating interval and intensity are controlled by said microprocessor.

12. The apparatus according to claim 11, wherein said means for measuring said diode mismatch offset voltage at said output of said balanced diode mixer is operatively coupled to said microprocessor, and said mixer diodes are heated in known increments until said diode mismatch offset voltage equals approximately zero volts.

13. The apparatus according to claim 12, wherein said microprocessor determines a relative power output level of said local oscillator based upon the amount of heating required to cause said offset voltage to equal approximately zero volts.

14. The apparatus according to claim 7 wherein said means for measuring said diode mismatch offset voltage at said output of said balanced diode mixer is operatively coupled to a microprocessor.

15. The apparatus according to claim 14 wherein said heating interval and intensity are controlled by said microprocessor, and said microprocessor causes said diode mismatch offset voltage to be measured before and after heating at least one of said first and second series connected mixer diodes.

16. A method for determining the operability of a mixer and local oscillator combination in a microwave receiver, said method comprising:

operating said mixer by coupling a microwave signal from said local oscillator to a mixer local oscillator input port;

heating at least one non-linear mixing component of said mixer to modify its electrical characteristics such that a mismatch between electrical characteristics of said at least one non-linear mixing component and electrical characteristics of at least one additional component of said mixer is accentuated;

measuring an output of said mixer after heating said at least one non-linear mixing component to determine an output characteristic, and comparing said output characteristic to a baseline level.

* * * * *